US008198180B2

(12) United States Patent
Del Agua Borniquel et al.

(10) Patent No.: US 8,198,180 B2
(45) Date of Patent: Jun. 12, 2012

(54) ION IMPLANTED SUBSTRATE HAVING CAPPING LAYER AND METHOD

(75) Inventors: Jose Ignacio Del Agua Borniquel, Kessel-Lo (BE); Tze Poon, Sunnyvale, CA (US); Robert Schreutelkamp, Leuven (BE); Majeed Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/974,653

(22) Filed: Dec. 21, 2010

(65) Prior Publication Data

US 2011/0092058 A1 Apr. 21, 2011

Related U.S. Application Data

(63) Continuation of application No. 12/367,306, filed on Feb. 6, 2009, now Pat. No. 7,858,503.

(51) Int. Cl.
*H01L 21/20* (2006.01)

(52) U.S. Cl. .......... 438/506

(58) Field of Classification Search .......... 438/506
See application file for complete search history.

(56) References Cited

U.S. PATENT DOCUMENTS 5,552,342 A 9/1996 Itou et al.
6,171,945 B1 1/2001 Mandal et al.
6,541,367 B1 4/2003 Mandal
6,559,070 B1 * 5/2003 Mandal .......... 438/781
6,583,071 B1 6/2003 Weidman et al.
6,596,627 B2 * 7/2003 Mandal .......... 438/622
6,656,840 B2 12/2003 Rajagopalan et al.
6,841,006 B2 1/2005 Barnes et al.
6,875,687 B1 4/2005 Weidman et al.
6,936,551 B2 8/2005 Moghadamn et al.
7,045,437 B1 * 5/2006 Xie .......... 438/448
7,075,165 B2 7/2006 Leon et al.
7,151,881 B2 12/2006 West et al.
7,256,139 B2 8/2007 Moghadamn et al.
7,297,376 B1 11/2007 Yim et al.
7,381,052 B2 6/2008 Zhao et al.
7,410,916 B2 8/2008 Ho et al.
7,413,957 B2 8/2008 Nouri et al.
7,422,776 B2 9/2008 Yim et al.
7,431,585 B2 10/2008 Zhao et al.
7,501,354 B2 3/2009 Ho et al.
7,611,996 B2 * 11/2009 Schmitt et al. .......... 438/759
7,858,503 B2 12/2010 Borniquel et al.
2005/0227502 A1 10/2005 Schmitt et al.
2007/0254491 A1 11/2007 Cheung
2008/0153271 A1 * 6/2008 Foad et al. .......... 438/513
2009/0087977 A1 * 4/2009 Spuller et al. .......... 438/593

FOREIGN PATENT DOCUMENTS

JP 2004-111638 A 4/2004
WO WO-2006/033699 A2 3/2006

OTHER PUBLICATIONS

International Search Report and Written Opinion of the ISA/KR (KIPO) in PCT Appl. No. PCT/US09/69754, Jul. 27, 2010 (Seo-gu, Daejeon, Korea).

* cited by examiner

*Primary Examiner* — Thao P. Le
(74) *Attorney, Agent, or Firm* — Ashok K. Janah; Janah & Associates, P.C.

(57) ABSTRACT

In an ion implantation method, a substrate is placed in a process zone and ions are implanted into a region of the substrate to form an ion implanted region. A porous capping layer comprising dispersed gas pockets is deposited on the ion implanted region.

20 Claims, 3 Drawing Sheets

46
58 44a 44b
40

ION IMPLANTED SUBSTRATE HAVING CAPPING LAYER AND METHOD

CROSS-REFERENCE

The present application is a continuation of U.S. patent application Ser. 12/367,306, filed on Feb. 6, 2009, entitled "Ion Implanted Substrate Having Capping Layer and Method", which is being incorporated herein by reference in its entirety.

BACKGROUND

Embodiments of the present invention relate to implanting ions in a substrate to form ion implantation regions.

Ion implanted regions are formed on a substrate to change the energy band gap level of material in a region of the substrate. For example, ions of boron, phosphorous arsenic, and other materials, are implanted in silicon or compound semiconductor materials to form semiconducting regions. As another example, ions are implanted in substrates comprising quartz, group III or group V compounds (e.g. GaAs), to form photovoltaic cells for solar panels. As yet another example, ions are implanted in substrates comprising gallium nitride to form light emitting diode (LED) for display panels.

However, in some ion implantation processes, a large percentage of the implanted ions evaporate or volatilize during the ion implantation process, or afterwards in subsequent processes. For example, diffusion and volatilization of implanted ions can occur in annealing processes which are performed after an ion implantation process is completed. As an example, ion implanted regions of a substrate comprising a silicon wafer are annealed to more uniformly distribute the ions in the implant regions, electrically activate the implant, and remove lattice defects. Such an annealing process can be conducted by heating the substrate to a temperature of at least about 950° C. However, the heat applied during the annealing process can cause the implanted ions to volatilize from the substrate, especially for high ion concentrations in shallow junctions.

For reasons including these and other deficiencies, and despite the development of various ion implantation methods and structures, further improvements in ion implantation technology are continuously being sought.

SUMMARY

In an ion implantation method, a substrate is placed in a process zone and ions are implanted into a region of the substrate to form an ion implanted region. A porous capping layer comprising dispersed gas pockets is deposited on the ion implanted region.

In another ion implantation method, a substrate is placed in a process zone and ions are implanted into a region of the substrate to form an ion implanted region. A porous capping layer comprising dispersed microscopic gas pockets is deposited on the ion implanted region. The substrate is annealed to volatize at least 80% of the porous capping layer overlying the ion implanted region during the annealing process.

In yet another ion implantation method, arsenic ions are implanted into a region of a substrate to form an ion implanted region. A porous capping layer comprising silicon-containing material having dispersed microscopic gas pockets is deposited on the ion implanted region. The substrate is annealed to volatize at least 80% of the porous capping layer overlying the ion implanted region during the annealing process.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
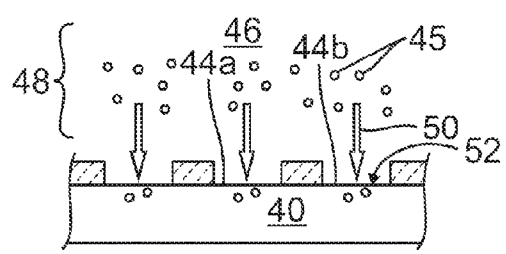
FIGS. 1A and 1B are cross-sectional schematic side views of an ion implantation process being performed on a substrate to form a plurality of ion implanted regions in the substrate.
Figure 1B:
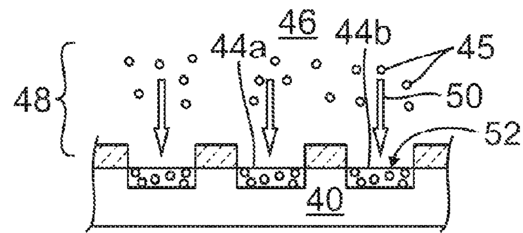
Figure 1C:
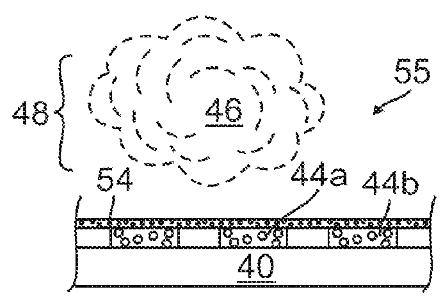
FIG. 1C is a cross-sectional schematic side view of the substrate of FIG. 1B, showing a porous capping layer being deposited over the ion implanted regions to form an intermediate product.

In a process for fabricating a substrate 40 for semiconductor, solar panel, LED and other applications, a plurality of ion implanted regions 44*a,b* are formed on the substrate as shown in FIGS. 1A and 1B. The substrate 40 may be a material such as, for example, any one or more of silicon oxide, silicon carbide, crystalline silicon, strained silicon, silicon germanium, doped or undoped polysilicon, doped or undoped silicon wafers, doped silicon, germanium, gallium arsenide, gallium nitride, glass, sapphire and quartz. The substrate 40 can have different dimensions, for example, the substrate 40 can be a circular wafer having a diameter of 200 mm or 300 mm, or a rectangular or square panel.

The ions 45 implanted in the ion implantation regions 44*a,b* depend upon the application of the substrate 40. For example, the ion implantation regions 44*a,b* can be used to form gate and/or source drain structures of a transistor of an integrated circuit chip by implanting n-type and p-type dopants into a substrate 40 comprising a silicon wafer. Suitable ions 45 that form n-type dopants when implanted in silicon include, for example, at least one of phosphorous, arsenic, antimony and combinations thereof. Suitable ions 45 that form p-type dopants include, for example, at least one of boron, aluminum, gallium, thallium, indium, silicon and combinations thereof. Thus, when a p-type conductivity dopant such as boron is implanted into silicon in an ion implantation region 44*a,b*, which is adjacent to another ion implantation region (not shown) which has been previously doped with an n-type dopant such as arsenic or phosphorous, then a p-n junction is formed along the boundary between the two regions. The ions can be implanted to a selected dosage level of, for example, a dosage of from $1\times10^{14}$ atoms/cm$^3$ to $1\times10^{17}$ atoms/cm$^3$.

In the implantation process, the substrate 40 is placed in a process zone 46 and the substrate temperature is maintained at between about 25° C. and about 400° C. A process gas is introduced into the process zone 46 to provide the ion source species to be implanted. The process gas can also include a volatile species such as fluorine and/or hydrogen. For example, the process gas can include ion implantation gases comprising the fluorides and/or hydrides of arsenic, boron, phosphorous, etc. The ion implantation gas can include, for example, $AsF_3$, $AsH_3$, $B_2H_6$, $BF_3$, $SiH_4$, $SiF_4$, $PH_3$, $AsF_5$, $P_2H_5$, $P0_3$, $PF_3$, $PF_5$ and $CF_4$. The fluoride and the hydride of a particular gas can also be combined, for example, $BF_3$+$B_2H_6$, $PH_3$+$PF_3$, $AsF_3$+$AsH_3$, $SiF_4$+$SiH_4$, or $GeF_4$+$GeH_4$. In one embodiment, the ion implantation gas can have a flow rate of between about 2 sccm and about 1000 sccm.

The process gas can further include an inert or nonreactive gas, such as $N_2$, Ar, He, Xe, and Kr. The inert or nonreactive gas promotes the ion bombardment to increase process gas collisions and reduce recombination of ion species. The flow rate of the inert or non-reactive gas can be from about 10 sccm to about 1200 sccm.

The process gas can further include a nitrogen-containing gas to assist the formation of the volatile byproducts which are more readily pumped out of the processing chamber. The nitrogen containing gas may include NO, $NO_2$, $NH_3$, $N_2$, $N_2O$ and mixtures thereof. The nitrogen-containing gas can be supplied at a flow rate of from about 10 sccm to about 500 sccm.

The process gas is ionized to form a plasma 48 containing ions 45 of the atomic species to be implanted to the substrate 40. These ions are accelerated (as shown by the arrows 50 in FIGS. 1A and 1B) by a voltage potential applied across to process zone 46 to form ions that energetically impinge upon, and enter into, the exposed regions 52 of the substrate 40 to form ion implanted regions. The process gas can be energized by source power which is inductively coupled power applied to antennas (not shown) about the process zone 46, and a bias power which is capacitively coupled power applied to electrodes (not shown) about the process zone 46, or combinations of source and bias power. Typically, the source power generates the plasma 48 from the process gas, and the bias power further dissociates the process gas and also accelerates the dissociated ions 45 toward the substrate 40. The source and bias power are set to predefined energy levels to allow the ion species to be driven to the desired depth into the substrate 40. Dissociated ions with low ion energy are implanted at a shallow depth of less than 500 Å, for example, from about 10 Å to about 500 Å from the substrate surface. Dissociated ions with high ion energy generated from high RF power, for example higher than about 10 KeV, may be implanted into the substrate 40 to a depth of over 500 Å from the substrate surface. In one example, the source power is maintained at from about 50 to about 2000 Watts, and the bias power is maintained at from about 50 to about 11000 Watts with an RF voltage of from about 10 to about 12000 Volts.

In an exemplary embodiment, arsenic ions can be implanted into a substrate 40 in a process zone 46. The substrate 40 is maintained at a temperature of less than 30° C. In this process, a process gas comprising an arsenic-containing gas, such as $AsH_3$, is introduced into the process zone 46. The process gas is maintained at a pressure of from about 3 mTorr to about 2 Torr, for example about 20 mTorr. The process gas is energized to form a plasma by powering an antenna (not shown) about the process zone 46, at a voltage of from about 200 to about 8000 volts, for example, about 6000 volts. The source power applied to the antenna can be from about 100 to about 3000 Watts, for example, about 1000 Watts. The resultant plasma comprises energized arsenic ions that are implanted into the substrate 40 to form ion implanted regions 44*a,b* comprising arsenic-implanted regions. The arsenic ions are implanted to a depth of less than 500 Å from the substrate surface in a dosage of at least about $1\times10^{16}$ atoms/$cm^3$.

In a prospective example, boron ions can be implanted into the substrate 40 from a plasma of a process gas comprising a boron-containing gas such as, for example, boron trifluoride gas ($BF_3$). The process gas is energized to generate a plasma of sufficient energy density to dissociate the $BF_3$ molecules, thereby forming ions of $B^+$, as well as $BF^+$, and possibly $BF_2^+$. The process gas is maintained at a pressure of from about 5 mTorr to about 3 Torr. Decaborane powder, which has a vapor pressure of the order of 0.1 Torr at room temperature, and produces a substantial vapor pressure at temperatures above 100° C., can also be used as a source, or to supplement a gaseous source, of boron ions.

In another prospective example, which represents an exemplary boron implantation process, the process gas includes $BF_3$ and $SiH_4$, which are dissociated as ion species by the plasma in the form of $B^{3+}$, $BF^{2+}$, $BF_2^{2+}$, F, $Si_4$ and H. The active hydrogen species provided by $SiH_4$ gas reacts with dissociated F species and other dissociated byproducts, to form HF or other types of volatile species, thus preventing the F species and other types of the byproducts being implanted into the substrate 40. Thus, the $SiH_4$ gas flow is selected to prevent the excess or dissociated Si ions from forming an undesired silicon film on the substrate. In one embodiment, the process gas comprises $BF_3$ and $SiH_4$ in a flow ratio of from about 1:50 to about 1:100. For example, the $BF_3$ flow rate can be from about 50 to about 400 sccm, and the $SiH_4$ flow rate can be from about 1 to about 20 sccm. The source RF power is set from about 100 Watts to about 2000 Watts and the bias RF power is set from about 100 Volts to about 12000 Volts. The resultant plasma implants boron ions into the substrate 40 to form ion implanted regions 44*a,b* comprising boron-implanted regions.

In a further prospective example, phosphorous doping can be performed using a process gas comprising a phosphorous-containing gas such as, for example, a phosphorous fluoride gas such as, for example, $PF_3$ or $PF_5$, or a phosphorous hydride gas such as $PH_3$. The process gas is introduced into the process zone 46 and maintained at a pressure of from about 10 mTorr to about 3 Torr. For example, $PF_3$ gas can be supplied at a flow rate of from about 50 sccm to about 1000 sccm. The source RF power may be set from about 100 watts to about 3000 Watts and the bias RF power may be set from about 100 Volts to about 12000 Volts. The resultant plasma implants phosphorous ions into the substrate 40 to form the ion implanted regions 44*a,b* comprising phosphorus-implanted regions.

Figure 2:
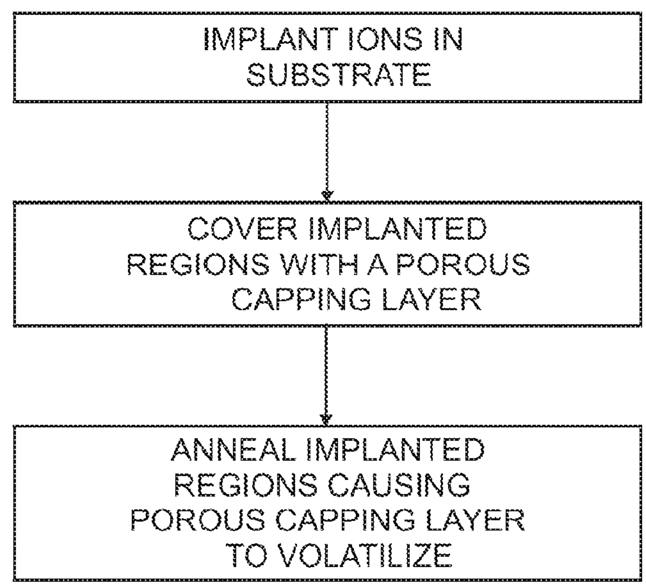
FIG. 2 is a flowchart of the ion implantation, capping, and vaporization processes.

In an exemplary embodiment, after implantation of the ions, a porous capping layer 54 is deposited on the ion implanted regions 44*a,b* as shown in the flow chart of FIG. 2. The porous capping layer 54 covers the ion implanted regions 44*a,b* to form an intermediate product 55, as shown in FIG. 10. The porous capping layer 54 is provided to prevent the volatilization of ions implanted in the ion implantation regions 44*a,b* in subsequent processes such as, for example, an annealing process. However, the annealing process can cause a large portion of the implanted ions to evaporate or volatilize off the substrate 40, especially when the implanted ions have a low mass, low binding energy, or low solubility with the substrate. The porous capping layer 54 was discovered to reduce the volatilization losses of the implanted ions, thereby preserving a larger percentage of ions within the implanted regions 44*a,b*, even after the annealing process.

It was further discovered that the porous capping layer 54 can be easily vaporized and removed after, or during, the annealing process. It is also believed that the porosity of the porous capping layer 54 allows vaporized material emanating from underlayer(s) to more easily escape and pass through the pores of the capping layer 54. This prevents the porous capping layer 54, when strongly bonded or adhered to underlayer(s), from delaminating with an attached underlayer. Also, the porous capping layer 54 has less mass because much of the volume is taken up by empty pore space, and accordingly, the layer 54 requires less energy to be vaporized off the substrate 40. Thus, in one version, the porous capping layer 54 comprises a porosity of at least 20%, or even at least 50%. Further, the porous capping layer 54 can have continuous pores with a pore volume of at least 20%, or even at least about 50%. The continuous pores are desirable as they more easily allow vaporization gases and byproducts to escape through the porous capping layer 54 without delamination.

In one version, the porous capping layer 54 comprises silicon- and oxygen-containing material. In this version, the porous capping layer 54 is deposited by introducing a process gas comprising silicon- and oxygen-containing gas into the process zone 46 and energizing the process gas to form a plasma using a plasma enhanced (PECVD) or microwave enhanced chemical vapor deposition (MECVD) process to deposit silicon dioxide. While silicon dioxide is described to illustrate the present process, it should be noted that other materials can also be used to form the porous capping layer 54. Also, the deposited silicon and oxygen material can include carbon, hydrogen or even nitrogen. For example, the porous capping layer 54 of silicon dioxide can be deposited with a process gas comprising a silicon-containing gases, such as for example, silane ($SiH_4$), disilane, dichlorosilane, trichlorosilane, and tetraethylorthosilane, methylsilane ($CH_3SiH_3$), dimethylsilane ($(CH_3)_2SiH_2$), trimethylsilane ($(CH_3)_3SiH$), diethylsilane ($(C_2H_5)_2SiH_2$), propylsilane ($C_3H_8SiH_3$), vinyl methylsila ($CH_2{=}CH)CH_3SiH_2$), 1,1,2,2-tetramethyl disilane ($HSi(CH_3)_2—Si(CH_3)_2H$), hexamethyl disilane ($(CH_3)_3Si—Si(CH_3)_3$), 1,1,2,2,3,3-hexamethyl trisilane ($H(CH_3)_2Si—Si(CH_3)_2—SiH(CH_3)_2$), 1,1,2,3,3-pentamethyl trisilane ($H(CH_3)_2Si—SiH(CH_3)—SiH(CH_3)_2$), and other silane related compounds. The process gas can also include an oxygen-containing gas, such as oxygen ($O_2$), nitrous oxide ($N_2O$), ozone ($O_3$), and carbon dioxide ($CO_2$).

The intermediate product 55 comprising the deposited porous capping layer 54 comprising silicon/oxygen containing material has microscopic gas pockets that are uniformly dispersed in a silicon oxide layer. In one exemplary version, a capping layer 54 comprising porous silicon oxide is deposited on the substrate 40 in the same process zone 46. A process gas comprising a silicon-containing gas and an oxygen-containing gas is introduced into the process zone 46. For example, the process gas can include silane and oxygen, in a volumetric flow ratio of from about 1:1 to about 1:10, or even from about 1:2 to about 1:6. For example, the flow rate of silane can be from about 5 to about 50 sccm, and the flow rate of oxygen can be from about 20 to about 200 sccm. Optionally, argon is added to the process gas. When argon is added, the volumetric flow ratio of silane to oxygen is maintained at the levels described above, and sufficient argon is added to maintain the oxygen to argon volumetric flow ratio at from about 1:4 to about 4:1. The process gas is maintained at a pressure of from about 5 mTorr to about 500 mTorr, for example about 100 mTorr. The plasma is generated from RF energy applied to an antenna about the process zone 46 at a voltage of from about 200 to about 10,000 volts, for example about 1000 volts, and at power level of from about 1000 watts to about 10,000 watts, for example, about 8000 Watts. The substrate 40 is maintained at a temperature of less than 30° C. to cause a porous capping layer 54 to form on the substrate.

In another prospective example, the porous capping layer 54 is formed with a process gas comprising a silicon-containing gas comprising trimethylsilane ($(CH_3)_3—SiH$) and oxygen. The trimethlysilane is provided at a flow rate of from about 20 to about 100 sccm and oxygen at a flow rate of from about 10 to about 200 sccm. The process gas can also include helium or nitrogen at a flow rate of from about 10 to about 5000 sccm. The chamber pressure is maintained at between about 1 and about 15 Torr. An RF power source is applied at from about 100 to about 900 watts. The substrate 40 is maintained at a temperature of from about 300° to about 450° C., to deposit the porous capping layer 54.

As yet another prospective example, the porous capping layer 54 is deposited using a process gas comprising tetraethylorthosilane (TEOS) at a flow rate of from about 200 from about 2000 sccm, and oxygen at a flow rate of from about 200 to about 2000 sccm. The plasma is powered with RF energy at from about 300 to about 1200 Watts. The substrate 40 is maintained to temperature from about 300 to about 500° C.

Figure 1D:
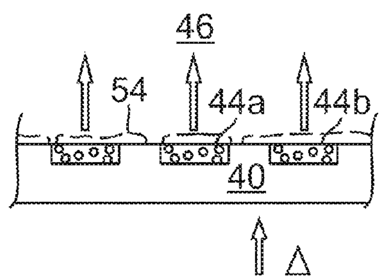
FIG. 1D is a cross-sectional schematic side view of the substrate of FIG. 1C showing annealing of the ion implanted regions and the capping layer being vaporized in the annealing process.

The ion implanted regions 44*a,b* having the overlying the porous capping layer 54 are annealed to more uniformly distribute the ions implanted into the ion implanted regions, as shown in FIGS. 1D and 2. For example, an ion concentration variation of $1\times10^{17}$ atm/cm$^2$ can be reduced to $1\times10^{13}$ atm/cm$^2$ in an annealing process. The annealing process can also remove, or reduce, the lattice defects in the ion implanted regions 44*a,b* which can be caused by the energetic impingement of the implanted ions. The annealing process can also be used to activate the implanted ions. In one exemplary annealing process, the substrate 40 is heated to a temperature of at least about 1000° C., or even from about 800° C. to about 1300° C. A suitable annealing process can be performed for about 5 minutes.

In the annealing process, at least a portion of the porous capping layer 54 volatizes during the heat treatment process. In one version, at least 80% of the porous capping layer 54 overlying the ion implanted region is volatilized during annealing. For example, during annealing, at least 90% of the porous capping layer 54 can be volatilized while still retaining at least 60% of the implanted ions within the ion implantation regions 44*a,b*. Thus the porous capping layer 54 retains ions within the ion implantation regions 44*a,b*, while simultaneously vaporizing off the substrate 40. Advantageously, this process allows retention of a large percentage of the implanted ions while removing substantially all of the porous capping layer 54.

Figure 1E:
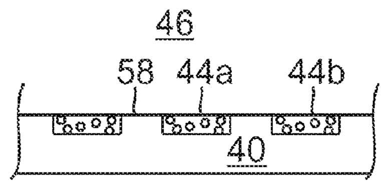
FIG. 1E is a cross-sectional schematic side view of the substrate of FIG. 1D after the capping layer has been vaporized from the ion implanted regions.

While most of the porous capping layer 54 is vaporized during annealing of the intermediate product to form a next-stage product, residual material from the layer 54 which is not vaporized, as shown in FIG. 1D, can be removed by a dry cleaning or plasma cleaning process, or a wet etching process. In a suitable dry cleaning or plasma cleaning process, a process gas comprising fluorine, such as $CF_4$ can be introduced into the process zone 46, and a plasma generated from the process gas is used to clean off residual silicon- and oxygen-containing material from the surface of the substrate 40. The resultant substrate 40 comprises ion implanted regions 44*a,b* which have uniformly distributed ion concentrations, reduced lattice defects, and a clean surface 58 as shown in FIG. 1E.

Figure 3:
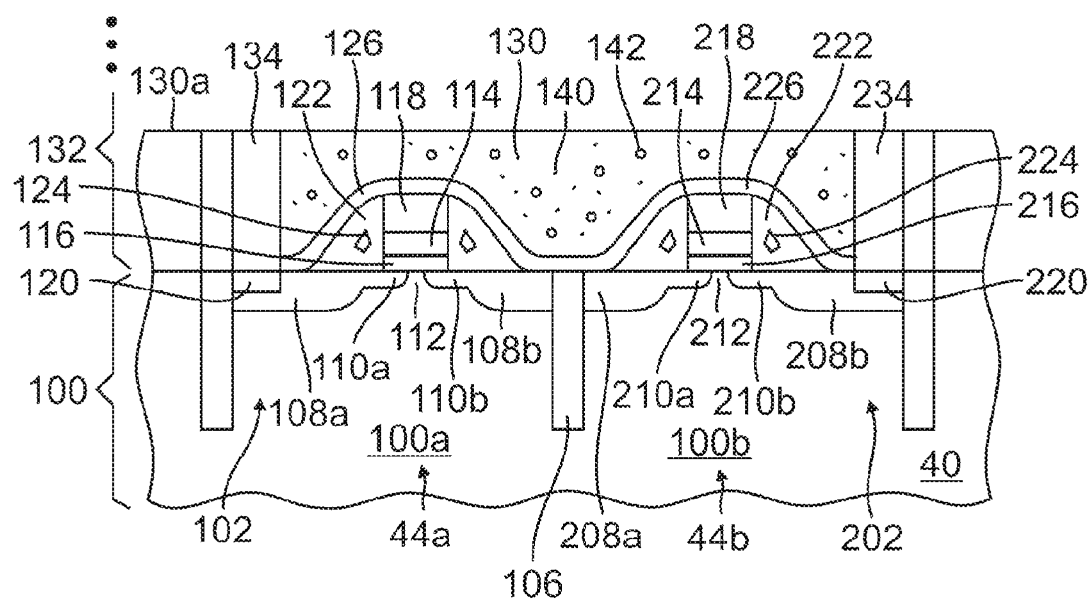
FIG. 3 is a cross-sectional schematic view of an integrated circuit comprising PMOS and NMOS transistors.

An exemplary embodiment of an integrated circuit comprising PMOS and NMOS transistors that can be fabricated using the present process is illustrated in FIG. 3. In this structure, a substrate 40 comprising a silicon wafer, has an active semiconductor layer 100*a,b* which can be the bulk semiconducting silicon material (as shown), or a silicon island (not shown) formed on an insulating layer over the substrate 40. A PMOS transistor 102 is formed in a lightly n-doped region 100*a* of the active layer 100, and an NMOS transistor 202 is formed in a lightly p-doped region 100*b* of the active layer 100. The p- and n-doped regions 100*a*, 100*b*, are insulated from one another by a shallow isolation trench 106 etched into the active layer and filled with an insulating material such as silicon dioxide. The PMOS transistor 102 also includes heavily p-doped source and drain regions 108*a*, 108*b* in the active layer and heavily p-doped source and drain extensions 110*a*, 110*b* separated by an n-doped channel 112.

The ion implanted regions 44*a,b* can be, for example, any one of the lightly n-doped region 100*a*, lightly p-doped region 100*b*, heavily p-doped source and drain regions 108*a*, 108*b*, and heavily p-doped source and drain extensions 110*a*, 110*b*, which are separated by an n-doped channel 112. In this version, immediately after deposition of any of the ion implanted regions 44*a,b*, a porous capping layer (not shown) is used to cover the ion implanted regions 44*a,b* to prevent volatilization of the ions during a subsequent annealing process that can be performed on the substrate 40. Thereafter, the substrate 40 with the ion implantation regions 44*a,b* is annealed. In the annealing process, substantially all of the porous capping layer 54 vaporizes. Thereafter, others layers are deposited, etched and otherwise processed onto the substrate 40.

In the PMOS transistor 102, a polycrystalline silicon gate electrode 114 overlies the channel 112 and is separated from it by a thin gate silicon dioxide layer 116. A gate contact 118 comprising for example, titanium silicide or cobalt silicide, overlies the gate electrode 114. A source contact region 120 also comprising, for example, titanium silicide or cobalt silicide, is formed in the source region 108*a*. A silicon nitride insulation layer 122 overlies the source and drain region 108*a*, 108*b* and surrounds the gate electrode structure 114, 116, 118. Silicon dioxide islands 124 lie within the insulation layer 122. A thin silicon nitride etch stop layer 126 overlies the PMOS transistor 102. The bottom insulation layer 130 of an overlying multiple interconnect layer 132 overlies the etch stop layer 126. After the insulation layer 130 is formed, a chemical mechanical polishing process can be used to flatten its top surface 130*a*. A metallic source contact 134, such as for example, tin, extends vertically through the insulation layer 130 and through the etch stop layer 126 to the titanium silicide source contact region 120. The insulation layer may be silicon dioxide ($SiO_2$), or silicon dioxide-containing combinations such as phosphorus silicate glass (PSG), boron silicate glass (BSG) or carbon-doped silicate glass (CSG). Such combinations can be formed in a plasma-enhanced deposition process using a process gas containing an oxygen-containing gas, a silicon precursor (e.g., silane), phosphorus precursor gas ($PH_3$), boron precursor gas ($B_2H_6$) or carbon-containing gas.

The NMOS transistor 202 includes heavily n-doped source and drain regions 208*b*, 208*a* in the active layer and heavily n-doped source and drain extensions 210*b*, 210*a* separated by a p-doped channel 212. A polycrystalline silicon gate electrode 214 overlies the channel 212 and is separated from it by a thin gate silicon dioxide layer 216. A gate contact 218 comprising, for example, titanium silicide overlies the gate electrode 214. A titanium silicide source contact region 220 is formed in the source region 208*b*. A silicon nitride insulation layer 222 overlies the source and drain region 208*b*, 208*a* and surrounds the gate electrode structure 214, 216, 218. Silicon dioxide islands 224 lie within the insulation layer 222. A thin silicon nitride etch stop layer 226 overlies the NMOS transistor 202. The bottom insulation layer 130 of the overlying multiple interconnect layer 132 overlies the etch stop layer 226. A metallic (e.g., TiN) drain contact 234 extends vertically through the insulation layer 130 and through the etch stop layer 226 to the titanium silicide source contact region 220.

Figure 4:
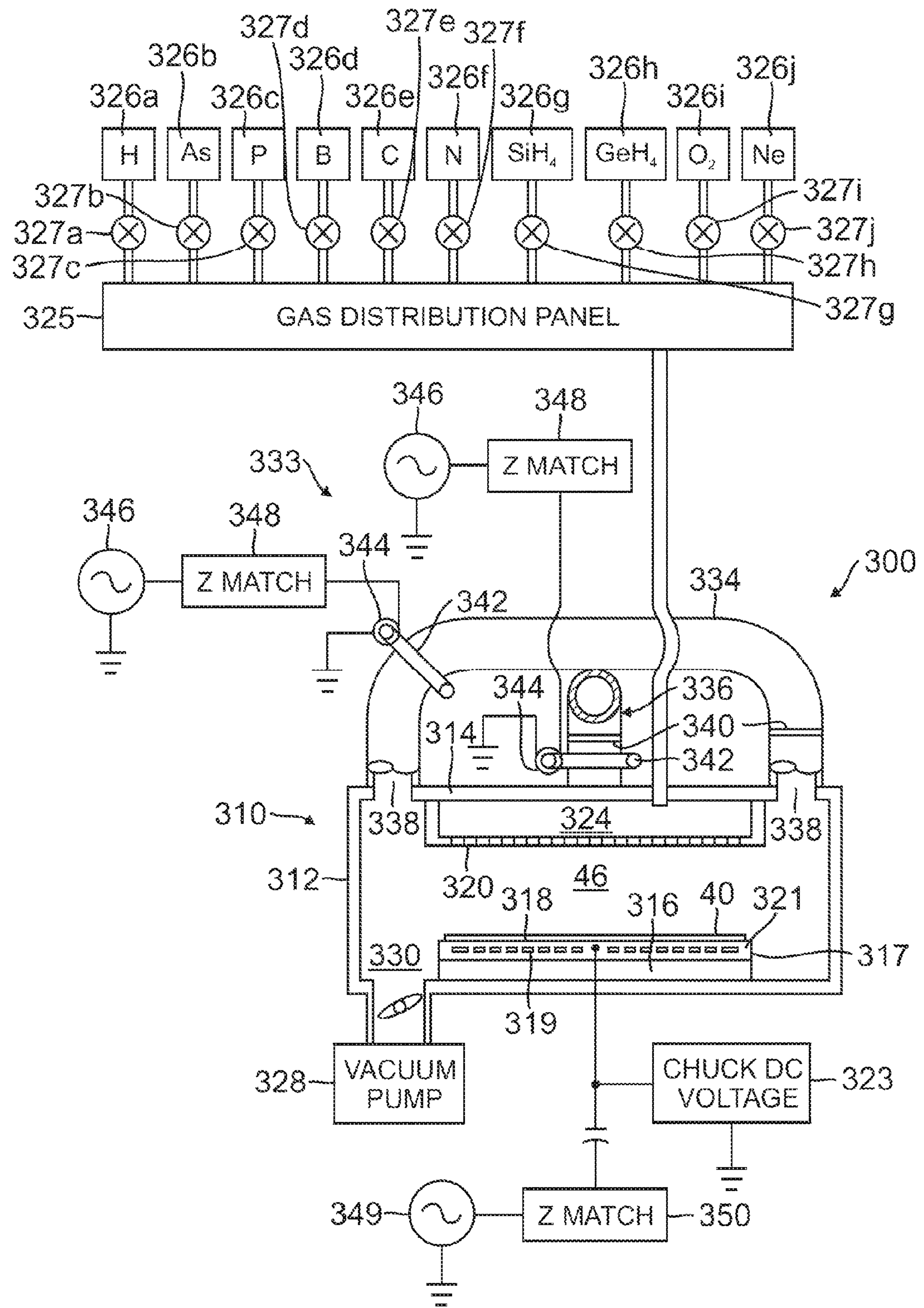
FIG. 4 is a cross-sectional schematic side view of an apparatus suitable for practicing the ion implantation and capping processes.

An exemplary embodiment of a substrate processing apparatus 300 suitable for implanting ions to form the ion implanted regions 44*a,b* in a substrate 40, and also capable of depositing the porous capping layer 54 over the implanted regions 44*a,b* in the same process zone 46, is shown in FIG. 4. The substrate processing apparatus 300 can be, for example, a torroidal source plasma immersion ion implantation apparatus, such as the P3I™, commercially available from Applied Materials, Santa Clara, Calif. A suitable apparatus is described in, for example, U.S. Patent Application Publication No. 2005/0191828, to Al-Bayati et al., filed on Dec. 1, 2004, which is incorporated by reference herein and in its entirety.

Generally, the apparatus 300 comprises a process chamber 310 enclosed by a cylindrical side wall 312 and a disk-shaped ceiling 314. A substrate support 316 in the chamber 310 comprises a substrate receiving surface 318 for supporting a substrate 40 for processing of the substrate in a process zone 46. The substrate support 316 can be an electrostatic chuck 317 which includes an electrode 319 embedded in, or covered by, a dielectric plate 321. The electrode 319 is powered by a chuck DC voltage source generator 323.

A process gas comprising ion implantation gases that contain the species to be ion implanted into the substrate 40 is introduced into the process zone 46 through the gas distributor 320. The gas distributor 320 on the ceiling 314 of the chamber 310 receives the process gas via a gas manifold 324 connected to a gas distribution panel 325. The gas manifold 324 is fed by the individual gas supplies 326*a-j* which are individually controlled by a set of mass flow controllers 327*a-j* that set the flow of a gas from each gas supply 326*a-j* to control the composition of the process gas. For example, the individual gas supplies 326*a-j* can include supplies of arsenic-containing gas, phosphorus-containing gas, boron-containing gas, carbon-containing gas, hydrogen, oxygen, nitrogen, silane, germanium-hydride gas, krypton, xenon, argon, or other gases. The gas supplies 326*a-j* can contain different dopant-containing gases including fluorides of boron, hydrides of boron, fluorides of phosphorous and hydrides of phosphorous. Other gases include gases used in co-implantation (hydrogen and helium), material enhancement (nitrogen), surface passivation or co-implantation (fluorides of silicon or germanium or carbon), and photoresist removal and/or chamber cleaning (oxygen gas). A vacuum pump 328 is coupled to a pumping annulus 330 defined between the substrate support 316 and the sidewall 312.

The process gas is energized in the process zone 46 above the substrate 40. A gas energizer 333 suitable for energizing the process gas in the process zone 46 includes a pair of external reentrant conduits 334, 336, which establish reentrant torroidal paths for plasma currents that pass through, and intersect in, the process zone 46. Each of the conduits 334, 336 has a pair of ends 338 coupled to opposite sides of the chamber 310. Each conduit 334, 336 is a hollow conductive tube and has a D.C. insulation ring 340 which prevents the formation of a closed loop conductive path between the two ends of the conduit. An annular portion of each conduit 334, 336, is surrounded by an annular magnetic core 342. An excitation coil 344 surrounds the core 342 and is coupled to an RF power source 346 through an impedance match device 348. The two RF power sources 346 coupled to respective cores 344 may be of two slightly different frequencies. For example, the gas energizer 333 can form inductively coupled plasma from the process gas by applying an RF current having a frequency of 400 kHz and 15 MHz. The RF power coupled from the RF power generators 346 produces plasma ion currents in closed torroidal paths extending through each respective conduit 334, 336 and through the process zone 46. These ion currents oscillate at the frequency of the respective RF power source.

During the ion implantation process, the gas energizer 333 applies a source power from the RF generators 346 to the reentrant conduits 334, 336 to create torroidal plasma currents in the conduits and in the process zone 46. Bias power is applied to the substrate support 316 by a bias power generator 349 through an impedance match circuit 350. The ion implantation depth is determined by the substrate bias voltage applied by the RF bias power generator 349. The ion implantation rate or flux, which is the number of ions implanted per square cm per second, is determined by the plasma density, which is controlled by the level of RF power applied by the RF generators 346. The cumulative implant dose (ions/square cm) in the substrate 40 is determined by both the flux and the total time over which the flux is maintained.

When the porous capping layer 54 is deposited on the substrate 40, the source power generators 346 can be used without using the bias power generator 349 to generate a plasma without accelerating ions towards the substrate 40. In this process, the process gas is dissociated to form ions, neutrals and other species that react with one another or the substrate surface to deposit the porous capping 54 layer on the substrate 40.

In either the ion implantation or capping layer deposition processes, alternative sources of energy can be used to form a plasma, energize ions, and react the process gas. For example, instead of inductive coupling, a plasma can also be generated using any conventional or high density plasma generating source, including for example, capacitive plasma sources, electron cyclotron resonance, or transformer coupled plasma. Thus, the scope of the present claims should not be limited to the exemplary apparatus described herein.

The present invention has been described with reference to certain preferred versions thereof; however, other versions are possible. For example, alternative ion implanting processes can also be used. Also, different materials can be used for the capping layer 54 as would be apparent to those of ordinary skill in the art. Therefore, the spirit and scope of the appended claims should not be limited to the description of the preferred versions contained herein.

What is claimed is:

1. An ion implantation method comprising:

(a) implanting ions into a region of a substrate to form an ion implanted region; and (b) depositing a porous capping layer on the ion implanted region, the porous capping layer comprising dispersed gas pockets, by introducing a process gas into a process zone and energizing the process gas to form a plasma.

2. A method according to claim 1 wherein (b) comprises depositing a porous capping layer comprising dispersed gas pockets that are microscopic gas pockets.

3. A method according to claim 1 wherein (b) comprises depositing a porous capping layer having at least one of the following properties:

(i) a porosity of at least 20%; and (ii) a pore volume of at least 20%.

4. A method according to claim 1 wherein (b) comprises depositing a porous capping layer comprising silicon and oxygen.

5. A method according to claim 1 wherein (b) comprises depositing a porous capping layer comprising silicon dioxide.

6. A method according to claim 5 comprising depositing the silicon dioxide by energizing a process gas comprising silane and oxygen.

7. A method according to claim 1 comprising during (a) or (b) maintaining the substrate at a temperature of between about 25° C. and about 400° C.

8. A method according to claim 1 further comprising annealing the substrate to volatilize at least a portion of the porous capping layer.

9. A method according to claim 1 comprising annealing the substrate to volatilize at least 90% of the porous capping layer while retaining at least 60% of the implanted ions in the ion implanted region.

10. A method according to claim 1 wherein (a) comprises implanting ions comprising arsenic, boron or phosphorous, in a dosage from $1\times10^{14}$ atoms/cm$^3$ to $1\times10^{17}$ atoms/cm$^3$.

11. A method according to claim 1 wherein (a) comprises implanting arsenic ions by energizing a process gas comprising an arsenic-containing gas.

12. An ion implantation method comprising:

(a) implanting ions into a region of a substrate to form an ion implanted region;

(b) depositing a porous capping layer on the ion implanted region, the porous capping layer comprising dispersed microscopic gas pockets, by introducing a process gas into a process zone and energizing the process gas to form a plasma; and (c) annealing the substrate to volatilize at least 80% of the porous capping layer overlying the ion implanted region during the annealing process.

13. A method according to claim 12 wherein (b) comprises depositing a porous capping layer having at least one of the following properties:

(i) a porosity of at least 20%; and (ii) a pore volume of at least 20%.

14. A method according to claim 12 wherein (b) comprises depositing a porous capping layer comprising silicon and oxygen.

15. A method according to claim 12 wherein (b) comprises depositing a porous capping layer comprising silicon dioxide.

16. An ion implantation method comprising:

(a) implanting arsenic ions into a region of a substrate to form an ion implanted region;

(b) depositing on the ion implanted region, a porous capping layer comprising silicon-containing material having dispersed microscopic gas pockets, by introducing a process gas into a process zone and energizing the process gas to form a plasma; and (c) annealing the substrate to volatilize at least 80% of the porous capping layer overlying the ion implanted region during the annealing process.

17. A method according to claim 16 wherein (b) comprises depositing a porous capping layer comprising silicon dioxide.

18. A method according to claim 16 wherein (a) comprises implanting the arsenic ions using a process gas comprising arsenic fluoride or arsenic hydride.

19. A method according to claim 16 wherein (a) comprises maintaining the substrate at a temperature of between about 25° C. and about 400° C.

20. A method according to claim 16 wherein (c) comprises annealing the substrate to a temperature of from about 800° C. to about 1300° C.

* * * * *